(12) United States Patent
Wieczorek et al.

(10) Patent No.: US 6,274,511 B1
(45) Date of Patent: Aug. 14, 2001

(54) METHOD OF FORMING JUNCTION-LEAKAGE FREE METAL SILICIDE IN A SEMICONDUCTOR WAFER BY AMORPHIZATION OF REFRACTORY METAL LAYER

(75) Inventors: Karsten Wieczorek, Reichenberg-Boxdorf (DE); Nick Kepler, Saratoga; Paul R. Besser, Sunnyvale, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/256,781

(22) Filed: Feb. 24, 1999

(51) Int. Cl.[7] .................. H01L 21/31; H01L 21/469; H01L 21/44; H01L 21/3205
(52) U.S. Cl. .................. 438/766; 438/664; 438/655; 438/682; 438/592
(58) Field of Search ................. 438/664, 766, 438/592, 663, 798, 765, 423, 649, 655, 682

(56) References Cited

U.S. PATENT DOCUMENTS

| | | | |
|---|---|---|---|
| 4,683,645 | * 8/1987 | Naguib | 437/41 |
| 5,536,684 | * 7/1996 | Dass et al. | 437/201 |
| 5,998,294 | * 12/1999 | Clayton et al. | 438/659 |
| 6,037,204 | * 8/1998 | Chang et al. | 438/231 |
| 6,072,222 | * 6/2000 | Nistler | 257/383 |

FOREIGN PATENT DOCUMENTS 0 651 076   5/1995  (EP).

OTHER PUBLICATIONS

"Doping Technologies", Materials and Bulk Processes, SIA Roundup, 1994, pp. 118–121.

"Ultra Shallow Junction Formation Using Diffusion from Silicides", H. Jiang et al., J. Electrochem. Soc., vol. 139, No. 1, Jan. 1992, pp. 196–218.

* cited by examiner

*Primary Examiner*—Vu A. Le
*Assistant Examiner*—Adam Pyonin

(57) ABSTRACT

A method for forming ultra shallow junctions in a semiconductor wafer with reduced junction leakage arising from a silicidation process due to grain boundary induced stress induced junction spiking amorphizes the metal layer prior to annealing during silicidation. After the gate and source/drain junctions are formed in a semiconductor device, dopant or non-dopant material is implanted into the anamorphous metal layer that has been previously deposited over the gate and source/drain junctions. The ion implantation is performed at an energy level sufficient to amorphize the metal (e.g. cobalt), and substantially eliminate grain boundaries in the metal and release grain boundary induced stress. This prevents grain boundary stress induced diffusion of the metal during the first phase of the silicidation process, where the metal is the diffusing species. The silicide regions that are formed during subsequent annealing steps therefore do not exhibit junction spikes.

16 Claims, 3 Drawing Sheets

US 6,274,511 B1

METHOD OF FORMING JUNCTION-LEAKAGE FREE METAL SILICIDE IN A SEMICONDUCTOR WAFER BY AMORPHIZATION OF REFRACTORY METAL LAYER

FIELD OF THE INVENTION

The present invention relates to the field of semiconductor device manufacturing, and more particularly, to the formation of low resistivity self-aligned silicide regions on the gate and source/drain junctions.

BACKGROUND OF THE INVENTION

In the manufacture of integrated circuits, a commonly used practice is to form silicide on source/drain regions and on polysilicon gates. This practice has become increasingly important for very high density devices where the feature size is reduced to a fraction of a micrometer. Silicide provides good ohmic contact, reduces the sheet resistivity of source/drain regions and polysilicon gates, increases the effective contact area, and provides an etch stop.

A common technique employed in the semiconductor manufacturing industry is self-aligned silicide ("salicide") processing. Salicide processing involves the deposition of a metal that forms intermetallic with silicon (Si), but does not react with silicon oxide or silicon nitride. Common metals employed in salicide processing are titanium (Ti), cobalt (Co), and nickel (Ni). These common metals form low resistivity phases with silicon, such as $TiSi_2$, $CoSi_2$ and NiSi. The metal is deposited with a uniform thickness across the entire semiconductor wafer. This is accomplished using, for example, physical vapor deposition (PVD) from an ultra-pure sputtering target and a commercially available ultra-high vacuum (UHV), multi-chamber, DC magnetron sputtering system. Deposition is performed after both gate etch and source/drain junction formation. After deposition, the metal blankets the polysilicon gate electrode, the oxide spacers, the oxide isolation, and the exposed source and drain electrodes. A cross-section of an exemplary semiconductor wafer during one stage of a salicide formation process in accordance with the prior art techniques is depicted in FIG. 1.

As shown in FIG. 1, a silicon substrate 10 has been provided with the source/drain junctions 12, 14 and a polysilicon gate 16. Oxide spacers 18 have been formed on the sides of the polysilicon gate 16. The refractory metal layer 20, comprising cobalt, for example, has been blanket deposited over the source/drain junctions 12, 14, the polysilicon gate 16 and the spacers 18. The metal layer 20 also blankets oxide isolation regions 22 that isolate the devices from one another.

A first rapid thermal anneal (RTA) step is then performed at a temperature of between about 450°–700° C. for a short period of time in a nitrogen atmosphere. The nitrogen reacts with the metal to form a metal nitride at the surface of the metal, while the metal reacts with silicon and forms silicide in those regions where it comes in direct contact with the silicon. Hence, the reaction of the metal with the silicon forms a silicide 24 on the gate 16 and source/drain regions 12, 14, as depicted in FIG. 2.

After the first rapid thermal anneal step, any metal that is unreacted is stripped away using a wet etch process that is selective to the silicide. A second, higher temperature rapid thermal anneal step, for example above 700° C., is applied to form a lower resistance silicide phase of the metal silicide. The resultant structure is depicted in FIG. 3 in which the higher resistivity metal silicide 24 has been transformed to the lowest resistivity phase metal silicide 26. For example, when the metal is cobalt, the higher resistivity phase is CoSi and the lowest resistivity phase is $CoSi_2$. When the polysilicon and diffusion patterns are both exposed to the metal, the silicide forms simultaneously over both regions so that this method is described as "salicide" since the silicides formed over the polysilicon and single-crystal silicon are self-aligned to each other.

Titanium is currently the most prevalent metal used in the integrated circuit industry, largely because titanium is already employed in other areas of 0.5 micron CMOS logic technologies. In the first rapid thermal anneal step, the so-called "C49" crystallographic titanium phase is formed, and the lower resistance "C54" phase forms during the second rapid thermal anneal step. However, the titanium silicide sheet resistance rises dramatically due to narrow-line effects. This is described in European Publication No. 0651076. Cobalt silicide ($CoSi_2$) has been introduced by several integrated circuit manufacturers as the replacement for titanium silicide. Since cobalt silicide forms by a diffusion reaction, it does not display the narrow-line effects observed with titanium silicide that forms by nucleation-and-growth. Some of the other advantages of cobalt over alternative materials such as titanium, platinum, or palladium are that cobalt silicide provides low resistivity, allows lower-temperature processing, has a reduced tendency for forming diode-like interfaces, and etchants for cobalt are stable and can be stored in premixed form indefinitely.

One of the concerns associated with cobalt silicide technologies is that of junction leakage, which occurs when cobalt silicide is formed such that it extends to the bottom and beyond of the source and drain junctions. An example of this occurrence is depicted in FIG. 3. One of the sources of this problem is roughness at the interface of the cobalt silicide and the silicon. The interface roughness may be related to grain boundary stress induced cobalt diffusion. Cobalt is the diffusing species in the initial reaction with silicon in a first annealing step to form the monosilicide, CoSi. Grain boundary stress in cobalt creates fast diffusion paths that lead to inhomogeneities in the formed silicide. The inhomogeneities cause the interface of the CoSi and silicon (Si) to be uneven. Hence, the thickness of the CoSi is not uniform, and extends deeper into the source and drain junctions in certain areas. When a second annealing step is performed to form the lower resistivity phase disilicide $CoSi_2$, the silicide extends even further downwards towards the bottom of the source and drain junctions, and possibly through them. The rough interface and spike formation causes $CoSi_2$ induced excess junction leakage, which is related to the grain boundary stress induced cobalt diffusion. One way to account for this problem is to make the junctions deeper, so that the uneven silicide will not reach the bottom of the source and drain junctions. Making the junctions deeper, however, negatively impacts device performance.

SUMMARY OF THE INVENTION

There is a need for a method of producing ultra-shallow junctions while avoiding grain boundary stress induced junction spiking.

This and other needs are met by embodiments of the present invention which provide a method of forming ultra-shallow junctions in a semiconductor wafer with reduced junction leakage arising from a silicidation process. In this method, the gate and the source/drain junctions are formed and a metal layer having grain boundaries is deposited over the gate and source/drain junctions. The grain boundaries in the metal layer are then substantially eliminated and grain boundary induced stress is released. Annealing is then performed to form metal silicide regions on the gate and source/drain junctions.

In certain embodiments, the metal layer comprises cobalt and the step of substantially eliminating the grain boundaries includes amorphizing the cobalt by ion implantation of either a dopant or a nondopant. The elimination of grain boundaries and release of grain boundary induced stress prevents grain boundary stress induced diffusion of the cobalt during the first phase of the silicidation process, in which cobalt is the diffusing species. This serves to prevent the formation of junction spikes, which cause junction leakage.

The controllable nature of the interface allows ultra-shallow junctions to be formed, since there is a reduced risk of spikes extending to the bottom of the source/drain junctions. The present invention thereby provides sufficient distance between the bottom of the silicide and the bottom of the source/drain junction so that there will be no junction leakage.

The earlier stated needs are also met by another embodiment of the present invention which provides a method of forming silicide comprising depositing an anamorphous metal layer over a gate and source/drain junctions. The metal layer is then amorphized, followed by reacting the now amorphized metal layer with the gate and source/drain junctions to form metal silicide regions on the gate and source/drain junctions.

Additional features and advantages of the present invention will become readily apparent to those skilled in the art from the following detailed description, when embodiments of the invention are described, simply by way of illustration of the best mode contemplated for carrying out the invention. As will be realized, the invention is capable of other and different embodiments and its several details are capable of modifications and various obvious respects, all without departing from the invention. Accordingly, the drawings and description are to be regarded as illustrative in nature, and not as restrictive.

DETAILED DESCRIPTION OF THE INVENTION

The present invention allows ultra-shallow junction formation by releasing grain boundary stress to eliminate or reduce grain boundary stress induced metal diffusion in a silicidation process. This is accomplished in certain embodiments by ion implantation into a refractory metal layer following its deposition over the gate and source and drain junctions. This amorphizes the metal (which may be cobalt, for example) and thereby eliminates cobalt grain boundaries and releases the grain boundary stress. Fast outdiffusion of cobalt during silicidation is therefore avoided, preventing the formation of spikes that short-circuit the source and drain junctions. Since spike formation is avoided, the junctions may be designed to be shallower, leading to improved device performance.

Figure 1:
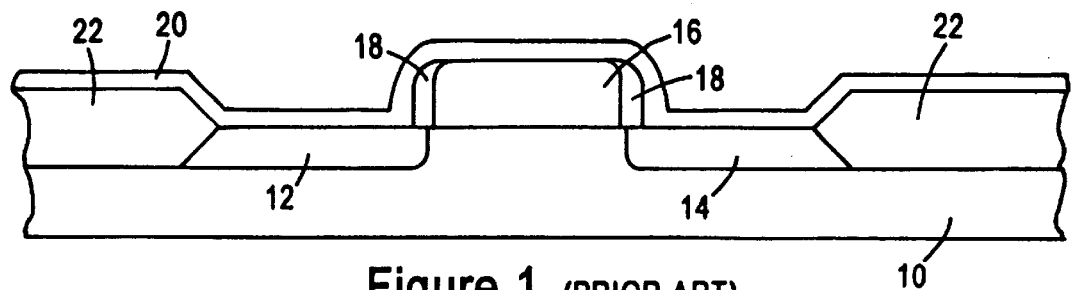
FIG. 1 is a cross-section of a portion of a semiconductor wafer processed in accordance with the prior art during one step of a salicide process.
Figure 2:
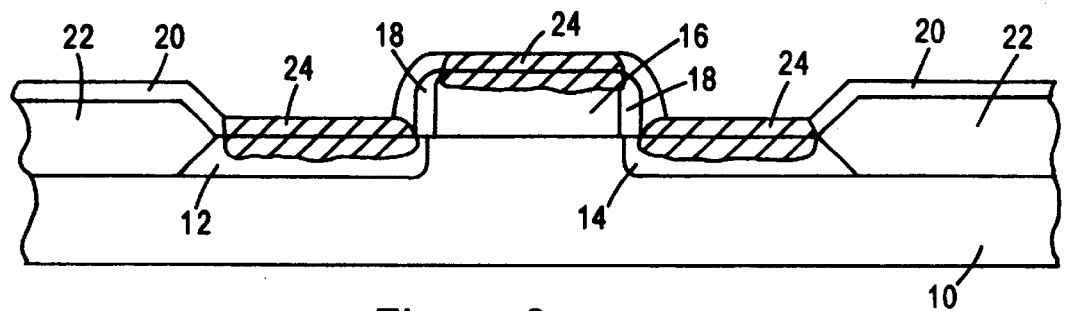
FIG. 2 depicts the cross-section of FIG. 1 after a first rapid thermal anneal step to form a high resistivity metal silicide region in accordance with the prior art.
Figure 3:
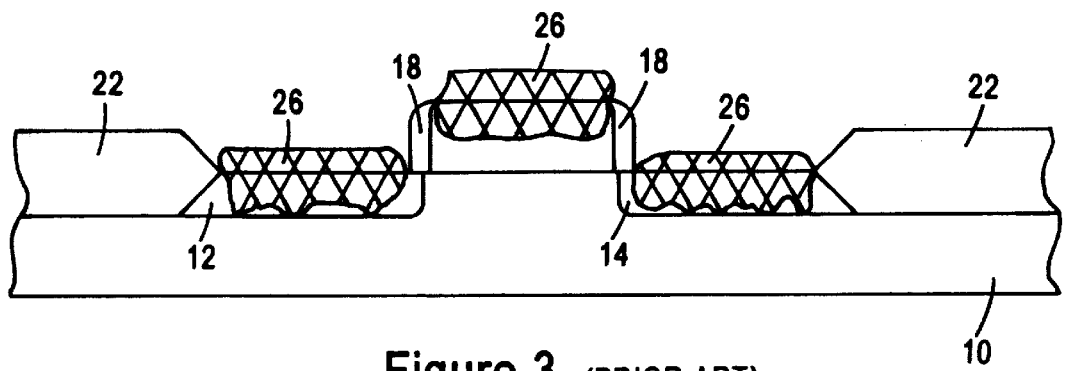
FIG. 3 is a cross-section of the semiconductor wafer of FIG. 2 following a selective etch of the non reacted refractory metal and a second rapid thermal annealing step to form lower resistivity metal silicide regions in accordance with the prior art, depicting an uneven silicide/silicon interface and spike formation.
Figure 4:
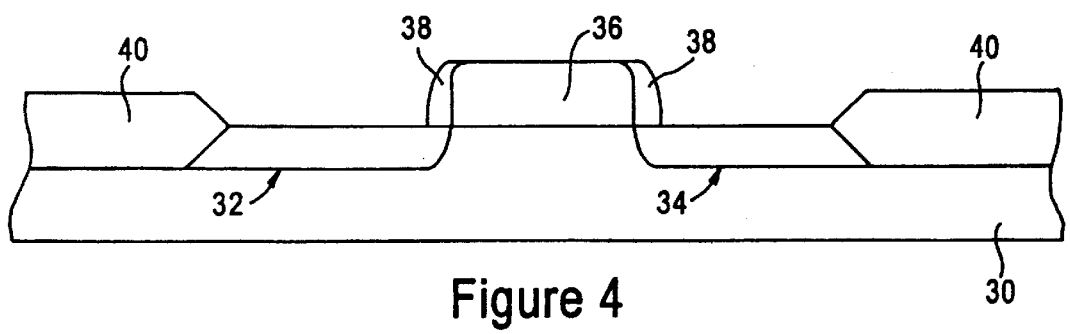
FIG. 4 is a cross-section of a portion of a semiconductor wafer prior to a salicidation process in accordance with certain embodiments of the present invention, following formation of the source and drain junctions.

FIG. 4 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

With the gate 36 and source/drain junctions 32, 34 now formed, a layer of refractory metal 42 is then deposited uniformly across the entire wafer, preferably using physical vapor deposition from an ultra-pure sputtering target and a commercially available ultra-high-vacuum, multi-chamber, DC magnetron sputtering system. In certain preferred embodiments, the metal is cobalt (Co), and the metal layer is deposited as a textured film. Cobalt has a number of advantages over other types of metals. For example, in comparison to silicon, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only. Another example of a metal that is the diffusing species in the first phase of a silicidation process is nickel (Ni).

Although it has a number of advantages over titanium, cobalt is not currently available in the form of amorphous sputter targets. Furthermore, there is currently no known manufacturable chemical vapor deposition (CVD) process for the deposition of amorphous cobalt. This means that the cobalt layer 42 that is deposited on the gate 36 and source and drain junctions 32, 34 will exhibit grain boundaries. The stress at these grain boundaries undesirably allows fast outdiffusion of cobalt during a first annealing step during which the higher resistivity phase cobalt silicide, CoSi, is formed. (Cobalt is the diffusing species in a first reaction to form the higher resistivity phase of the silicide, while silicon is the diffusing species in a second reaction to form the lower resistivity phase of the silicide, $CoSi_2$.) The fast outdiffusion of cobalt at the grain boundaries during the formation of the CoSi creates spikes at these grain boundaries, causing junction leakage.

The present invention prevents the fast outdiffusion of cobalt by amorphizing the cobalt layer to release the grain boundary stress. This overcomes the disadvantages of presently available deposited cobalt layers, which are anamorphous. In certain preferred embodiments, the amorphization is accomplished by ion implantation.

Figure 5:
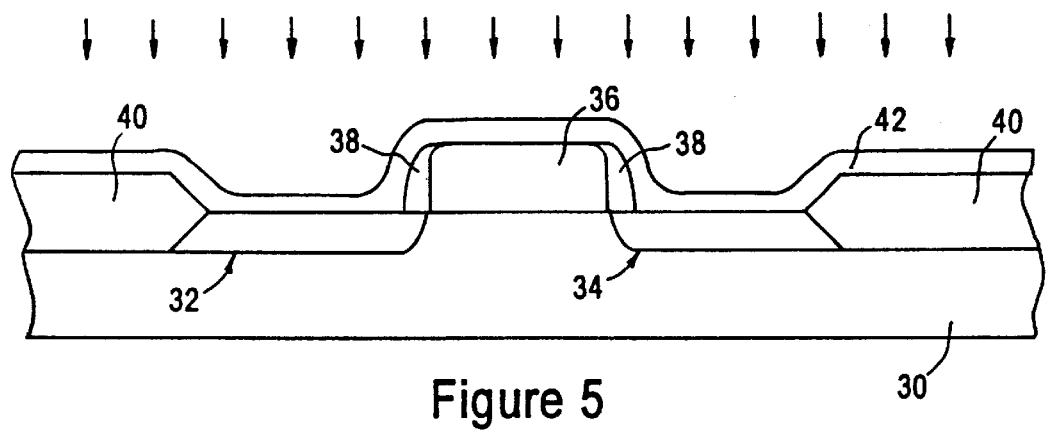
FIG. 5 is a depiction of the semiconductor device of FIG. 4, following the deposition of a metal layer, such as cobalt, and during implantation of ions into the metal layer in accordance with certain embodiments of the present invention.

FIG. 5 schematically depicts the ion implantation of a suitable implant material into the metal (e.g. cobalt) layer 42. The material may be a non-dopant, such as silicon or germanium, or a dopant, such as boron or phosphorous, although the invention is not limited to these exemplary materials.

The depth of the amorphous region is very controllable, and depends on the implantation energy. As an example, Ge may be implanted at a concentration of $1 \times 10^5$ cm$^{-2}$ and with an energy of 60 keV. This will amorphize the entire depth of the cobalt layer 42, assuming an exemplary layer depth of approximately 100 Å.

In certain embodiments, the implanting energy is set so as to amorphize the silicon (32, 34, 36) directly beneath the cobalt layer 42. This advantageously mixes the two reactants, cobalt and silicide, to further homogenize the interface and reduce the risk of spike formation during silicidation. As an example, Ge may be implanted at a concentration of $1 \times 10^{15}$ cm$^{-2}$ and with an energy of 80 keV. This will amorphize the silicon to a depth of about 50 Å, assuming the cobalt layer 42 has a thickness of about 100 Å.

When a non-dopant material, such as germanium or silicon, is to be implanted, an unmasked implantation procedure may be performed. The non-dopant material will not have deleterious effects on other structures on the wafer. A masked implantation procedure is employed when the material to be implanted is a dopant, so that the metal layer 42 is doped only over those areas in which it is desirable to dope, such as the gate 36 and the source and drain junctions 32, 34. In later processing, the dopants are outdiffused from the metal layer into the source and drain junctions 32, 34. For example, the outdiffusion may be achieved during the annealing steps employed to form the silicide. Hence, with this embodiment of the present invention, the primary doping of these regions may be achieved using the dopants implanted in the metal layer in accordance with the present invention, if no doping was performed prior to the deposition of the metal layer 42. Alternatively, the dopants may be used to enhance previous doping of these regions.

As the ion implantation process is readily and precisely controllable, the interface 37 may be made relatively smooth, so that the amorphous silicon region 35 is of substantially uniform thickness. This is advantageous since the thickness of the CoSi layer, and the later formed $CoSi_2$ layer are determined by the thickness of the amorphous silicon region 35. The more uniform the amorphous silicon region 35, the more uniform the interface between the $CoSi_2$ layer and the silicon region 35.

Figure 6:
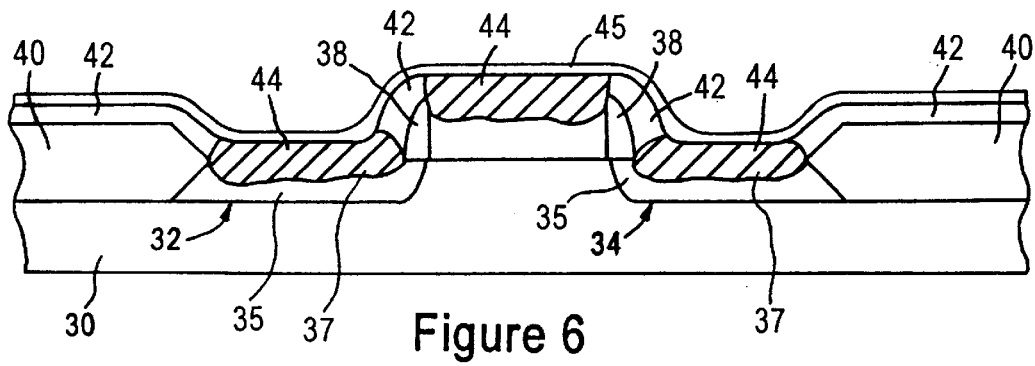
FIG. 6 depicts the semiconductor device of FIG. 5 following a first rapid thermal anneal step to form high resistivity metal silicide regions in accordance with embodiments of the present invention.

Following the metal layer 42, a capping layer 45 may be deposited to cap the middle layer 42 after the grain boundaries are eliminated. The capping layer 45 is depicted in FIG. 6. The capping layer 45 prevents interaction with an ambient during the annealing. The capping layer 45 may comprise at least one of titanium or titanium nitride, in preferred embodiments. The method of forming the capping layer 45 on the metal layer 42 is conventional, such as by chemical vapor deposition (CVD) or physical vapor deposition (PVD), as examples.

FIG. 6 depicts the semiconductor device of FIG. 5 after the formation of high resistivity metal silicide regions. In certain preferred embodiments, the high resistivity metal silicide regions 44 are created by a rapid thermal anneal step. The high resistivity metal silicide regions 44 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. In this step, cobalt is the diffusing species. In conventional cobalt layers, which are anamorphous, the cobalt fast outdiffuses at the grain boundaries and there is grain boundary stress. Spikes may be created at the grain boundaries, leading to junction leakage. However, the amorphization of the cobalt in accordance with the present invention substantially eliminates the cobalt grain boundaries and releases grain boundary induced stress. Also, depending on the implantation parameters, the silicon beneath the metal layer 42 may also be amorphized, so that the metal and the silicon can be intermixed. As is apparent from FIG. 6, some of the silicon in the source and drain junctions 32, 34 is consumed during the first rapid thermal annealing step to become part of the high resistivity metal silicide regions 44. This is true also for the silicon in the polysilicon gate 36.

The substantial elimination of the cobalt grain boundaries and release of grain boundary induced stress causes the interface between the high resistivity metal silicide regions 44 and the silicon to be relatively smooth. This advantage is enhanced in those embodiments in which the silicon is intermixed by the implantation.

Figure 7:
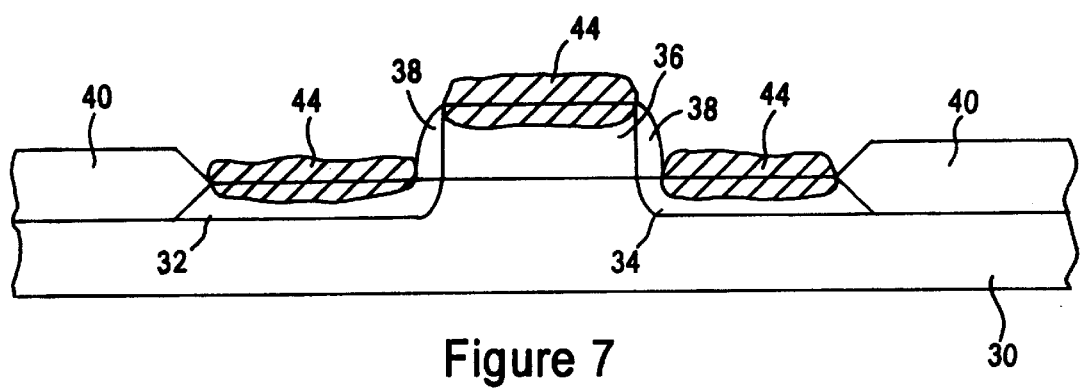
FIG. 7 depicts the semiconductor device of FIG. 6 following a selective etch that removes unreacted metal in accordance with embodiments of the present invention.

A selective etch is performed to remove any unreacted refractory metal, such as cobalt Typical etchants employed to remove unreacted cobalt are $3HCl:H_2O_2$ and $H_2SO_4:H_2O_2$. Removal of the unreacted metal by the peroxide solution leaves the silicide regions 44 intact. The resultant structure is depicted in FIG. 7.

Figure 8:
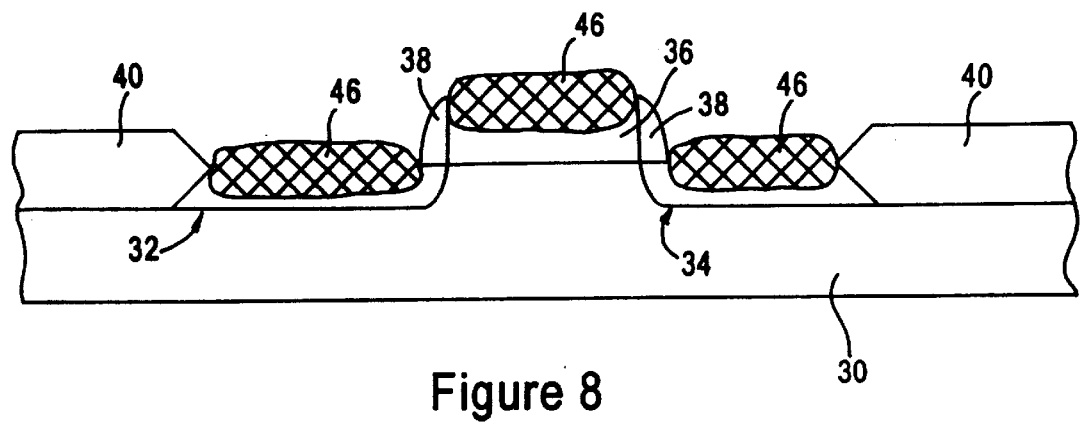
FIG. 8 is a depiction of the semiconductor device of FIG. 7 after a second rapid thermal annealing is performed to form lower resistivity metal silicide regions, in accordance with embodiments of the present invention.

A second rapid thermal anneal step is now performed to produce lower resistivity metal silicide regions 46, such as $CoSi_2$, as depicted in FIG. 8. The second rapid thermal anneal step exposes the semiconductor wafer to a higher temperature than employed in the first rapid thermal anneal step. For example, the temperature in this second rapid thermal anneal step is between about 600° C. and about 850° C. The semiconductor wafer is exposed to the high temperature for between about 5 and about 90 seconds. During this second rapid thermal anneal step, the higher resistivity monosilicide (e.g. CoSi) is converted to lower resistivity disilicide (e.g. $CoSi_2$).

During the second rapid thermal anneal step, silicon is the diffusing species and the silicide region expands somewhat, and extends deeper in the substrate. Advantageously, the $CoSi_2$ silicide/silicon interface generally follows the CoSi silicide/silicon interface and is therefore relatively smooth. Spike formation is avoided, preventing junction leakage.

Since the silicide/silicon interface is readily smoothed and spike formation prevented by the embodiments of the present invention that substantially eliminate cobalt grain boundaries and release cobalt grain boundary induced stress, there is little chance for the silicide to extend to the bottom and beyond of the junctions 32, 34. The controllability of the silicide depth and interface roughness allows shallower junctions to be employed than otherwise possible, since deeper junctions providing a relatively large margin of safety below the silicide to avoid junction leakage are rendered unnecessary. With shallower junctions, improvements in device performance are achieved.

The embodiments of the present invention allow ultra-shallow junctions to be formed and employed in a semiconductor device with a low resistivity metal silicide, such as cobalt ($CoSi_2$) while avoiding junction leakage due to grain boundary stress induced junction spiking. An exemplary embodiment has been described in which cobalt is employed as the refractory metal in forming the silicide. However, the present invention finds utility in other applications employing other materials in which a monosilicide is transferred to a disilicide, where the metal is the diffusing species in the first reaction, and silicon in the second reaction. Further, the embodiments describe ion implantation to amorphize the metal layer. This is also exemplary only, as the present invention is applicable to other methods of eliminating cobalt grain boundaries and releasing grain boundary induced stress to prevent spike formation.

Only certain preferred embodiments of the present invention and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming ultra-shallow junctions in a semiconductor wafer with reduced junction leakage arising from a silicidation process, comprising the steps of:

forming a gate and source/drain junctions;

depositing a metal layer over the gate and source/drain junctions, the metal layer having grain boundaries, wherein the metal in the metal layer is cobalt;

substantially eliminating grain boundaries in the metal layer and releasing grain boundary induced stress; and annealing to form metal silicide regions on the gate and source/drain junctions.

2. The method of claim 1, wherein the step of substantially eliminating grain boundaries includes amorphizing the metal layer.

3. The method of claim 2, wherein the step of amorphizing the metal layer includes implanting ions into the metal layer.

4. The method of claim 3, wherein the ions are of a non-dopant material.

5. The method of claim 4, wherein the non-dopant material is one of at least silicon and germanium.

6. The method of claim 5, wherein the ions are of a dopant material.

7. The method of claim 1, further comprising capping the metal layer with a capping layer after the grain boundaries are eliminated to thereby prevent interaction with an ambient during the annealing.

8. The method of claim 7, wherein the capping layer comprises at least one of titanium or titanium nitride.

9. The method of claim 6, further comprising outdiffusing the dopants from the metal layer into the source/drain junctions.

10. The method of claim 4, wherein the step of implanting includes implanting the non-dopant material ions with an implantation energy of between about 30 keV and about 100 keV.

11. The method of claim 4, wherein the step of implanting includes implanting the non-dopant material ions with an implantation energy sufficient to amorphize at least a portion of the source/drain junctions beneath the metal layer.

12. The method of claim 11, wherein the metal silicide regions are made of $CoSi_2$.

13. A method of forming silicide comprising:

depositing an anamorphous metal layer over a gate and source/drain junctions formed within semiconductor material, wherein the metal in the anamorphous metal layer is cobalt;

amorphizing the metal layer; and reacting the amorphized metal layer with the gate and source/drain junctions to form metal silicide regions on the gate and source/drain junctions.

14. The method of claim 13, wherein the step of amorphizing the metal layer includes implanting ions of non-dopant material into the metal layer at a sufficient energy to substantially eliminate grain boundaries in the metal layer and release grain boundary induced stress.

15. The method of claim 13, wherein the step of amorphizing the metal layer includes implanting ions of dopant material into the metal layer at a sufficient energy to substantially eliminate grain boundaries in the metal layer and release grain boundary induced stress.

16. The method of claim 15 further comprising outdiffusing the dopant material into the gate and source/drain junctions.

* * * * *